(12) United States Patent
Hronik

(10) Patent No.: US 7,069,406 B2
(45) Date of Patent: Jun. 27, 2006

(54) DOUBLE DATA RATE SYNCHRONOUS SRAM WITH 100% BUS UTILIZATION

(75) Inventor: Stanley A. Hronik, Sunnyvale, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 09/347,106

(22) Filed: Jul. 2, 1999

(65) Prior Publication Data

US 2003/0167374 A1 Sep. 4, 2003

(51) Int. Cl.
*G06F 12/00* (2006.01)

(52) U.S. Cl. ....................................... 711/168
(58) Field of Classification Search ................. 711/104, 711/167, 168, 169
See application file for complete search history.

(56) References Cited

U.S. PATENT DOCUMENTS

| | | | |
|---|---|---|---|
| 3,967,247 A | 6/1976 | Andersen et al. | |
| 4,096,402 A | 6/1978 | Schroeder et al. | |

(Continued)

FOREIGN PATENT DOCUMENTS

| | | |
|---|---|---|
| EP | 0276871 A2 | 8/1988 |
| EP | 0294287 B1 | 12/1988 |
| EP | 0432509 A2 | 6/1991 |
| EP | 0450871 A2 | 10/1991 |
| EP | 0655741 A2 | 5/1995 |
| EP | 0680049 A2 | 11/1995 |
| EP | 0692872 A2 | 1/1996 |
| EP | 1 130 603 | 9/2001 |
| JP | 2-112317 | 4/1990 |
| JP | 4-135311 | 8/1992 |

(Continued)

OTHER PUBLICATIONS

Nakamura, Kazuyuki et al., *SP 24.6: A 500MHz 4Mb CMOS Pipeline–Burst Cache SRAM with Point–to–Point Noise Reduction Coding I/O*, 1997 IEEE International Solid State Circuits Conference, Digest of Technical Papers, First Edition, Feb. 1997, pp. 406–407.

(Continued)

*Primary Examiner*—Matthew Kim
*Assistant Examiner*—Matthew D. Anderson
(74) *Attorney, Agent, or Firm*—Finnegan, Henderson

(57) ABSTRACT

A synchronous memory circuit is capable of double data transfer rate per clock cycle, 100% bus utilization (i.e., no idle clock cycles in bus turn arounds), and has only one clock cycle of latency in each of read and write burst operations. The memory circuit has a data bus 202, at least two memory blocks (20, 30), a multiplexer (120) for receiving two read data items from respective two memory blocks in a read burst operation and allowing one of the two read data items to be provided on the data bus half a clock cycle after the read burst operation is initiated and allowing the other one of the two read data items to be provided on the data bus one clock cycle after the read burst operation is initiated, and two registers (50, 70) for storing respective two write data items provided on the data bus in a first write burst operation wherein one of the two write data items is written to one of the two memory blocks at the initiation of a next write burst operation following the first write burst operation and the other one of the two write data items is written to the other one of the two memory blocks half a clock cycle after the initiation of the next write burst operation, wherein in two consecutive clock cycles the two write data items are capable of being transferred to the memory circuit via the data bus and the two read data items are capable of being transferred from the memory circuit via the data bus.

52 Claims, 2 Drawing Sheets

U.S. PATENT DOCUMENTS

| | | |
|---|---|---|
| 4,208,716 A | 6/1980 | Porter et al. |
| 4,225,922 A | 9/1980 | Porter |
| 4,371,929 A | 2/1983 | Brann et al. |
| 4,394,732 A | 7/1983 | Swenson |
| 4,394,733 A | 7/1983 | Swenson |
| 4,404,474 A | 9/1983 | Dingwall |
| 4,410,942 A | 10/1983 | Milligan et al. |
| 4,415,970 A | 11/1983 | Swenson et al. |
| 4,423,479 A | 12/1983 | Hanson et al. |
| 4,426,681 A | 1/1984 | Bacot et al. |
| 4,433,374 A | 2/1984 | Hanson et al. |
| 4,437,155 A | 3/1984 | Sawyer et al. |
| 4,442,488 A | 4/1984 | Hall |
| 4,476,526 A | 10/1984 | Dodd |
| 4,490,782 A | 12/1984 | Dixon et al. |
| 4,523,275 A | 6/1985 | Swenson et al. |
| 4,530,054 A | 7/1985 | Hamstra et al. |
| 4,530,055 A | 7/1985 | Hamstra et al. |
| 4,547,848 A | 10/1985 | Nishida et al. |
| 4,611,337 A | 9/1986 | Evans |
| 4,638,187 A | 1/1987 | Boler et al. |
| 4,695,943 A | 9/1987 | Keeley et al. |
| 4,755,930 A | 7/1988 | Wilson, Jr. et al. |
| 4,789,796 A | 12/1988 | Foss |
| 4,794,521 A | 12/1988 | Ziegler et al. |
| 4,796,231 A | 1/1989 | Pinkham |
| 4,817,058 A | 3/1989 | Pinkham |
| 4,882,709 A | 11/1989 | Wyland |
| 4,884,270 A | 11/1989 | Chiu et al. |
| 4,912,630 A | 3/1990 | Cochcroft, Jr. |
| 4,916,604 A | 4/1990 | Yamamoto et al. |
| 4,928,281 A | 5/1990 | Kurosawa et al. |
| 4,942,550 A | 7/1990 | Murray |
| 4,958,088 A | 9/1990 | Farah-Bakhsh et al. |
| 4,984,204 A | 1/1991 | Sato et al. |
| 5,022,011 A | 6/1991 | Allan |
| 5,043,937 A | 8/1991 | Glaise |
| 5,050,072 A | 9/1991 | Earnshaw et al. |
| 5,111,435 A | 5/1992 | Miyamoto |
| 5,122,690 A | 6/1992 | Bianchi |
| 5,128,560 A | 7/1992 | Chern et al. |
| 5,128,563 A | 7/1992 | Hush et al. |
| 5,134,311 A | 7/1992 | Biber et al. |
| 5,150,186 A | 9/1992 | Pinney et al. |
| 5,165,046 A | 11/1992 | Hesson |
| 5,170,074 A | 12/1992 | Aoki |
| 5,179,298 A | 1/1993 | Hirano et al. |
| 5,194,765 A | 3/1993 | Dunlop et al. |
| 5,195,056 A | 3/1993 | Pinkham et al. |
| 5,220,208 A | 6/1993 | Schenck |
| 5,239,206 A | 8/1993 | Yanai |
| 5,251,181 A | 10/1993 | Toda |
| 5,254,883 A | 10/1993 | Horowitz et al. |
| 5,274,276 A | 12/1993 | Casper et al. |
| 5,276,642 A | 1/1994 | Lee |
| 5,278,460 A | 1/1994 | Casper |
| 5,281,865 A | 1/1994 | Yamashita et al. |
| 5,311,481 A | 5/1994 | Casper et al. |
| 5,319,606 A | 6/1994 | Bowen et al. |
| 5,321,368 A | 6/1994 | Hoelzle |
| 5,321,651 A | 6/1994 | Monk |
| 5,341,341 A | 8/1994 | Fukuzo |
| 5,347,177 A | 9/1994 | Lipp |
| 5,347,179 A | 9/1994 | Casper et al. |
| 5,349,566 A | 9/1994 | Merritt et al. |
| 5,361,002 A | 11/1994 | Casper |
| 5,377,338 A | 12/1994 | Olson et al. |
| 5,383,157 A | 1/1995 | Phelan |
| 5,384,737 A | 1/1995 | Childs et al. |
| 5,384,745 A | 1/1995 | Konishi et al. |
| 5,387,809 A | 2/1995 | Yamagishi et al. |
| 5,390,308 A | 2/1995 | Ware et al. |
| 5,394,555 A | 2/1995 | Hunter et al. |
| 5,400,283 A | 3/1995 | Raad |
| 5,438,545 A | 8/1995 | Sim |
| 5,440,260 A | 8/1995 | Hayashi et al. |
| 5,457,407 A | 10/1995 | Shu et al. |
| 5,467,473 A | 11/1995 | Kahle et al. |
| 5,471,591 A | 11/1995 | Edmondson et al. |
| 5,473,575 A | 12/1995 | Farmwald et al. |
| 5,475,642 A | 12/1995 | Taylor |
| 5,483,497 A | 1/1996 | Mochizuki et al. |
| 5,487,035 A | 1/1996 | Nishimura et al. |
| 5,488,712 A | 1/1996 | Kiuchi |
| 5,497,127 A | 3/1996 | Sauer |
| 5,498,990 A | 3/1996 | Leung et al. |
| 5,502,676 A | 3/1996 | Pelley, III et al. |
| 5,506,814 A | 4/1996 | Hush et al. |
| 5,508,638 A | 4/1996 | Cowles et al. |
| 5,513,327 A | 4/1996 | Farmwald et al. .......... 710/129 |
| 5,515,325 A | 5/1996 | Wada |
| 5,526,320 A | 6/1996 | Zagar et al. |
| 5,546,344 A | 8/1996 | Fawcett |
| 5,561,781 A | 10/1996 | Braceras et al. |
| 5,568,077 A | 10/1996 | Sato et al. |
| 5,568,430 A | 10/1996 | Ting |
| 5,572,467 A | 11/1996 | Ghassemi et al. |
| 5,574,698 A | 11/1996 | Raad |
| 5,576,645 A | 11/1996 | Farwell |
| 5,577,236 A | 11/1996 | Johnson et al. |
| 5,578,941 A | 11/1996 | Sher et al. |
| 5,581,197 A | 12/1996 | Motley et al. |
| 5,581,718 A | 12/1996 | Grochowski |
| 5,581,734 A | 12/1996 | DiBrino et al. |
| 5,587,961 A * | 12/1996 | Wright et al. ................ 365/233 |
| 5,590,073 A | 12/1996 | Arakawa et al. |
| 5,594,700 A | 1/1997 | Ward et al. |
| 5,617,362 A | 4/1997 | Mori et al. |
| 5,619,453 A | 4/1997 | Roohparvar et al. |
| 5,619,473 A | 4/1997 | Hotta |
| 5,621,690 A | 4/1997 | Jungroth et al. |
| 5,627,780 A | 5/1997 | Malhi |
| 5,627,791 A | 5/1997 | Wright et al. |
| 5,631,872 A | 5/1997 | Naritake et al. |
| 5,636,163 A | 6/1997 | Furutani et al. |
| 5,636,173 A | 6/1997 | Schaefer |
| 5,636,174 A | 6/1997 | Rao |
| 5,638,335 A | 6/1997 | Akiyama et al. |
| 5,644,729 A | 7/1997 | Amini et al. |
| 5,650,971 A | 7/1997 | Longway et al. |
| 5,652,724 A | 7/1997 | Manning |
| 5,655,105 A | 8/1997 | McLaury |
| 5,659,696 A | 8/1997 | Amini et al. |
| 5,663,901 A | 9/1997 | Wallace et al. |
| 5,668,763 A | 9/1997 | Fujioka et al. |
| 5,675,549 A | 10/1997 | Ong et al. |
| 5,694,065 A | 12/1997 | Hamasaki et al. |
| 5,699,317 A | 12/1997 | Sartore et al. |
| 5,717,904 A | 2/1998 | Ehlers et al. |
| 5,737,276 A | 4/1998 | Shin et al. |
| 5,748,558 A | 5/1998 | Suzuki |
| 5,749,086 A * | 5/1998 | Ryan ......................... 711/105 |
| 5,754,815 A | 5/1998 | Ernst et al. |
| 5,757,704 A | 5/1998 | Hachiya |
| 5,761,147 A | 6/1998 | Lindner et al. |
| 5,761,150 A | 6/1998 | Yukutake et al. |
| 5,777,942 A | 7/1998 | Dosaka et al. |
| 5,781,480 A | 7/1998 | Nogle et al. |
| 5,781,481 A | 7/1998 | Iwakiri |
| 5,790,838 A | 8/1998 | Irish et al. |
| 5,793,688 A | 8/1998 | McLaury |

| | | | |
|---|---|---|---|
| RE35,934 E | 10/1998 | Takai | |
| 5,819,060 A | 10/1998 | Cesana | |
| 5,825,711 A | 10/1998 | Manning | |
| 5,828,606 A | 10/1998 | Mick | |
| 5,831,929 A | 11/1998 | Manning | |
| 5,838,631 A | 11/1998 | Mick | |
| 5,841,732 A | 11/1998 | Mick | |
| 5,847,577 A | 12/1998 | Trimberger | |
| 5,854,911 A | 12/1998 | Watkins | |
| 5,870,347 A | 2/1999 | Keeth et al. | |
| 5,875,151 A | 2/1999 | Mick | |
| 5,875,152 A | 2/1999 | Liu et al. | |
| 5,890,195 A | 3/1999 | Rao | |
| 5,915,105 A | 6/1999 | Farmwald et al. | 710/129 |
| 5,917,772 A | 6/1999 | Pawlowski | |
| 5,933,385 A | 8/1999 | Jiang et al. | |
| 5,978,311 A | 11/1999 | Wilford et al. | |
| 5,987,570 A * | 11/1999 | Hayes et al. | 711/140 |
| 6,044,429 A | 3/2000 | Ryan et al. | |
| 6,052,769 A | 4/2000 | Huff et al. | |
| 6,058,448 A | 5/2000 | Pawlowski | |
| 6,078,527 A | 6/2000 | Roth et al. | |
| 6,094,399 A | 7/2000 | Mick | |
| 6,144,616 A | 11/2000 | Suzuki | |
| 6,151,236 A | 11/2000 | Bondurant et al. | |
| 6,163,500 A | 12/2000 | Wilford et al. | |
| 6,167,487 A | 12/2000 | Camacho et al. | |
| 6,212,109 B1 | 4/2001 | Proebsting | |
| 6,219,283 B1 | 4/2001 | Wilford | |
| 6,249,480 B1 | 6/2001 | Mick | |
| 6,256,716 B1 | 7/2001 | Pham | |
| 6,259,648 B1 | 7/2001 | Kragick | |
| 6,272,064 B1 | 8/2001 | Wilford et al. | |
| 6,314,051 B1 | 11/2001 | Farmwald et al. | |
| 6,373,783 B1 | 4/2002 | Tomita | |
| 6,381,684 B1 * | 4/2002 | Hronik et al. | 365/189.04 |
| 6,438,066 B1 | 8/2002 | Ooishi et al. | |

FOREIGN PATENT DOCUMENTS

| | | |
|---|---|---|
| JP | 5-136664 | 1/1993 |
| JP | 5-282868 | 10/1993 |
| WO | WO 94/29871 | 12/1994 |
| WO | WO 97/03445 | 1/1997 |
| WO | WO 97/14289 | 4/1997 |
| WO | WO 97/15055 | 4/1997 |

OTHER PUBLICATIONS

Abstract of "Synchronous SRAMs having zero bus turn-around time,", Elektronik Industrie, Dec. 1996, 1 p.
Bapat, Shekhar, "Synthesizable 200 MHz ZBT SRAM Interface," Xilinx, Jan. 10, 2000, pp. 1–6.
Bennett, Steve, "SRAMs: if synchronous just isn't enough," Electronic Product Design, Jul. 1997, pp. 29–30.
Computer Design, "Application–specific memory evolves," Dec. 1998, pp. 1–4.
Cypress Design, "Application–specific memory evolves," Dec. 1998, pp. 1–4.
Cypress Semiconductor Corporation, "SRAMs & MODULES: NoBL™ SRAMs", 2001, pp. 1–2.
Cypress Semiconductor Corporation, "NoBL™ SRAM Fact Sheet," pp. 1–2.
Cypress Semiconductor Corporation, "Introduction to Cypress SRAMs," Apr. 20, 2001, pp. 1–3.
Cypress Semiconductor Corporation, "NoBL: The Fast SRAM Architecture," Jun. 29, 1998, pp. 1–8.
Cypress Semiconductor Corporation, "NoBL™, The ZBT™ –Compatible . . . ," Jun. 26, 1998, pp. 1–3.

Descriptive literature entitled, "400 MHz SLDRAM, 4M×16 SLDRAM Pipelined, Eight Bank, 2.5. V Operation," SLDRAM Consortium Advance Sheet, published throughout the U.S., pp. 1–22.
Dipert, Brian, "No–latency SRAMs tackle fast–changing data," Cypress Semiconductor, 1997, pp. 1–2.
"Draft Standard for a High–Speed Memory Interface (SyncLink)," Microprocessor and Microcomputer Standards Subcommittee of the IEEE Computer Society, Copyright 1996 by the Institute of Electrical and Electronic Engineers, Inc., New York, NY, pp. 1–56.
GSI Technology, "Computer Overview," Aug. 2001, pp. 1.5
IBM Preliminary, IBM043611RLAB, IBM041811RLAB, 32K×36; & 64K×18 SRAM, IBM Corporation (1996), pp. 1–20.
IBM Corporation Datasheet, "IBM043610QLAB, IBM041810QLAB: 32K×36 & 64K×18 SRAM," Jul., 1996, pp. 1–21.
IBM Corporation Datasheet, "IBM043611QLAB, IBM041811QLAB: 32K×36 & 64K×18 SRAM," Jul., 1996, pp. 1–21.
Integrated Device Technology, Inc., "IDT Introduces Industry's Fastest 4–Mbit Synchronous ZBT SRAM," Mar. 30, 1998, pp. 1–3.
Integrated Device Technology, Inc., "128K×36, 3.3V Synchronous SRAM with ZBT™ Feature, Burst Counter and Pipelined Outputs," Dec. 1999, pp. 1–20.
Integrated Device Technology, Inc., "IDT Introduces Revolutionary ZBT™ Synchronous SRAM Architecture," 1996, pp. 1–3.
Integrated Device Technology, Inc., "Self–Timed BiCMOS ECL Static RAM: 64K (16K×4–BIT) STRAM", Aug. 1992, pp. 1–8.
Matsumoto, Craig, "Cypress Details Product Road Map," Nov. 17, 1998, pp. 1–2.
Integrated Device Technology, Inc., News Release in Japanese, Sep. 15, 1997, pp, 1–2, no translation provided.
MacLellan, Andrew, "Rivals To Cooperate On SRAM Project," Jul. 26, 1999, pp. 1–2.
Motorola, "Dual Differential Clock Synchronous FSRAM with Very Late Write and Asynchronous /G", Print Date: Jul. 9, 1993, Rev. 1.03, pp. 13–16.
Motorola, "Semiconductor Technical Data: MCM69L738 & MCM69L820: Advance Information: $M Late Write 2.5 V I/O," 15 pp.
Motorola, "Semiconductor Technical Data: MCM62486: Product Review: 32K×9 Bit BurstRAM™ Synchronous Static RAM With Burst Counter and Self–Timed Write," 1991, pp. 1–4, 6, 8–9.
Motorola, Inc. "Semiconductor Technical Data: The Motorola BurstRAM™," Nov. 17, 1999, pp. 1–4.
Prince, Semiconductor Memories: A Handbook of Design, Manufacture and Application, 2d ed., 1991, pp. 467–472.
Semiconductor Business News, "Micron Samples 8–Mbit Smart ZBT SRAM," Oct. 21, 1999, 1 p.
Sony CXK77B3611 Advanced Information, "32,768–Word by 36–Bit High Speed BiCMOS Synchronous Static RAM", Dec. 10, 1994, pp. 1, 3, and 9).
Sweazey, Paul, "SRAM Organization, Control, and Speed, and their Effect on Cache Memory Design," 1987, pp. 434–437.
Taguchi, M. et al., "A 40–ns 64–Mb DRAM with 64–b Parallel Data Bus Architecture," IEEE Journal of Solid–State Circuits, vol. 26, Nov. 1991, pp. 1493–1497.

Will Wade, "IDT and Micron team up for smart ZBT SRAM," EE Times, Aug. 25, 1999, 1 p.

Gibson, Glenn A., *Computer Systems—Concepts and Design*, Prentice Hall, Inc., Englewood Cliffs, New Jersey, 1991, pp. 366–369 and 452–493.

Prince, Betty, *Semiconductor Memories*, Second Edition, (John Wiley & Sons ed., 1991) (1983) pp. 467–472.

"64K×32, 3.3V Synchronous SRAM With Pipelined Outputs and Interleaved/Linear Burst Counter, Preliminary IDT71V632," Integrated Device Technology, Inc., Product Information, Mar. 1997, 14 pages.

"64K×32, 3.3V Synchronous SRAM With Flow–Through Outputs–Preliminary IDT71V633," Integrated Device Technology, Inc., Product Information, Apr. 1997, 15 pages.

* cited by examiner

DOUBLE DATA RATE SYNCHRONOUS SRAM WITH 100% BUS UTILIZATION

BACKGROUND

1. Field of the Invention

The present invention relates to memory circuits, and more particularly to synchronous static random access memories (SRAMs) capable of transferring two data items per clock cycle and 100% bus utilization.

2. Description of Related Art

Asynchronous SRAMs have no input or output registers. Accessing an asynchronous SRAM is slow because the address and control signals (and the write data in case of a write operation) presented to the SRAM can not be changed for the duration of the SRAM access.

Synchronous SRAMs eliminate the requirement to hold the SRAM input signals (address, control, and data) during read or write operations by including clocked registers for storing the address, control, and read and write data. The set-up and hold times for the registers are typically much shorter than the time to access the memory array of the SRAM. This significantly reduces the SRAM's cycle time as viewed at the pins of the device, and thus the frequency of the system clock is increased.

The input and output registers however, cause two clock cycles of latency in the relation between the read address and read data, and no latency between the write address and write data (i.e., the address is clocked in and the data is clocked out in two consecutive clock cycles for a read, and the address and data are clocked in the same clock cycle for a write). This latency difference between read and write operations causes the address bus to remain idle for two clock cycles when a read cycle is followed by a write cycle, and causes the data bus to remain idle for two clock cycles when a write cycle is followed by a read cycle (i.e., bus turnaround). The idle cycles reduce the system data bandwidth.

Late write SRAMs partially correct the latency problem. In a late write SRAM, the number of idle cycles in a bus turnaround is reduced from two clock cycles to one by introducing one clock cycle of latency in the write. Zero bus turnaround (ZBT) synchronous SRAMs developed by Integrated Device Technology Inc. (U.S. Pat. No. 5,828,606, issued Oct. 27, 1998) eliminate idle cycles in a bus turn around by causing read and write operations to have the same clock cycle latency of two, and thus achieve 100% bus utilization. The two clock cycles of latency are however undesirable. Fewer cycles of latency, e.g., one, provide faster data availability and potentially faster and easier system design. (The ZBT SRAM latency can be reduced to one clock cycle, but only if no registers are provided on the SRAM output. This is undesirable because it increases the minimum cycle time.)

In all of the above SRAMs, at most one data item is transferred per clock cycle in either a read or a write operation. Double data rate (DDR) SRAMs transfer data into or out of the device on both the rising and falling clock edges, thus doubling the data transfer rate without increasing the clock frequency. One such device is the DDR late-write SRAM known as Claymore or MSUG-2 developed by a private consortium known as the Motorola Semiconductor Users Group (MSUG). This device was designed for high performance workstation level 2 cache operating in a point-to-point environment with data rates in excess of 500 MHz.

While the Claymore device meets the needs for increased bandwidth in high performance communications applications, the lost clock cycle in every bus turn around (associated with every late write device) results in inefficient use of the address and data buses.

Thus, there is a need for a synchronous DDR SRAM capable of 100% bus utilization with fewer clock cycles of latency than the ZBT SRAM.

SUMMARY

A synchronous memory circuit is capable of double data transfer rate per clock cycle, 100% bus utilization (i.e., no idle clock cycles in bus turn arounds), and has only one clock cycle of latency in each of read and write burst operations.

The synchronous memory circuit includes: an address bus for receiving an address; at least two memory blocks; and a data bus for receiving a data item for transfer to or from the at least two memory blocks, wherein in two consecutive clock cycles at least a first and a second write data items corresponding to a first write burst operation are capable of being transferred to the memory circuit via the data bus and at least a first and second read data items corresponding to a first read burst operation are capable of being transferred from the memory circuit via the data bus.

In another embodiment, the at least first and second write data items are provided on the data bus one clock cycle after the first write burst operation is initiated, and the at least first and second read data items are provided on the data bus one clock cycle after the first read burst operation is initiated.

In another embodiment, the memory circuit further includes at least one input terminal for receiving at least one read/write control signal for indicating a read burst or a write burst operation, wherein each of the first write burst operation and the first read burst operation is initiated upon a rising edge of a clock cycle by asserting the read/write control signal to indicate a write burst or a read burst. operation and providing a burst address at the address bus both prior to the rising edge of the clock cycle.

In another embodiment, the first write burst operation comprises writing at least a third and fourth write data items to respective two memory blocks so that writing the third write data item overlaps with writing the fourth write data item, the at least third and fourth write data items corresponding to a last write burst operation prior to the first write burst operation. In another embodiment, each of the at least third and fourth write data items is written in one clock cycle, and writing the third write data item overlaps with writing the fourth write data item during half a clock cycle.

In another embodiment, the first read burst operation comprises reading the at least first and second read data items from respective two memory blocks so that reading the first read data item overlaps with reading the second read data item. In another embodiment, each of the at least first and second read data items is read in one clock cycle, and reading the first read data item overlaps with reading the second read data item during half a clock cycle.

In another embodiment, the memory circuit further includes an output circuit for receiving the at least first and second read data items from respective at least two memory blocks in the first read burst operation and allowing the at least first read data item to be provided on the data bus half a clock cycle after the first read burst operation is initiated, and allowing the second read data item to be provided on the data bus one clock cycle after the first read burst operation is initiated.

In another embodiment, the output circuit includes a multiplexer for receiving a clock signal and the at least first and second read data items and sequentially transferring to an output bus of the multiplexer the at least first and second read data items in accordance with the state of the clock signal, and an output buffer for receiving the at least first and second read data items from the output bus of the multiplexer and providing the at least first and second read data items to the data bus when enabled, wherein the output buffer is enabled only when a valid read data item is to be provided on the data bus so that no external tracking of the progress of a read burst operation is required.

In another embodiment, the memory circuit is a static random access memory (SRAM).

A method of accessing the synchronous memory circuit includes the acts of: (A) initiating a first write burst operation for sequentially transferring at least a first and second write data items to the memory circuit in a first clock cycle; and (B) initiating a first read burst operation for sequentially transferring at least a first and second read data items from the memory circuit in a second clock cycle, wherein the first and second clock cycles are two consecutive clock cycles.

In another embodiment, the method further comprises: (C) initiating the first write burst operation in a third clock cycle, the first clock cycle being the next sequential clock cycle after the third clock cycle; and (D) initiating the first read burst operation in a fourth clock cycle, the second clock cycle being the next sequential clock cycle after the fourth clock cycle.

In another embodiment, act (C) comprises: (E) asserting a read/write control signal on an input terminal of the memory circuit to indicate a write burst operation prior to a rising edge of the third clock cycle; and (F) providing a first write burst address on an address bus of the memory circuit prior to the rising edge of the third clock cycle. Act (D) comprises: (G) asserting the read/write control signal to indicate a read burst operation prior to a rising edge of the fourth clock cycle; and (H) providing a first read burst address on the address bus prior to the rising edge of the fourth clock cycle.

In another embodiment, the memory circuit includes two memory blocks and act (A) comprises: (I) writing at least a third and fourth write data items to respective two memory blocks so that writing the third write data item overlaps with writing the fourth write data item, the at least third and fourth write data items corresponding to a last write burst operation prior to the first write burst operation. In another embodiment, act (I) comprises: (J) writing the third write data item in one clock cycle; and (K) writing the fourth write data item in one clock cycle, wherein writing the third write data item overlaps with writing the fourth write data item during half a clock cycle.

In another embodiment, act (B) comprises: (L) reading the at least first and second read data items from respective two memory blocks so that reading the first read data item overlaps with reading the second read data item. In another embodiment, act (L) comprises: (M) reading the first read data item in one clock cycle; and (N) reading the second read data item in one clock cycle, wherein reading the first read data item overlaps with reading the second read data item during half a clock cycle.

Other features and advantages of the invention are described below. The invention is defined by the appended claims.

BRIEF DESCRIPTION OF THE DRAWINGS

The present invention may be better understood, and its numerous objects, features, and advantages made apparent to those skilled in the art by referencing the accompanying drawings.

The use of the same reference symbols in the drawings indicates similar or identical items.

DESCRIPTION OF PREFERRED EMBODIMENTS

Figure 1:
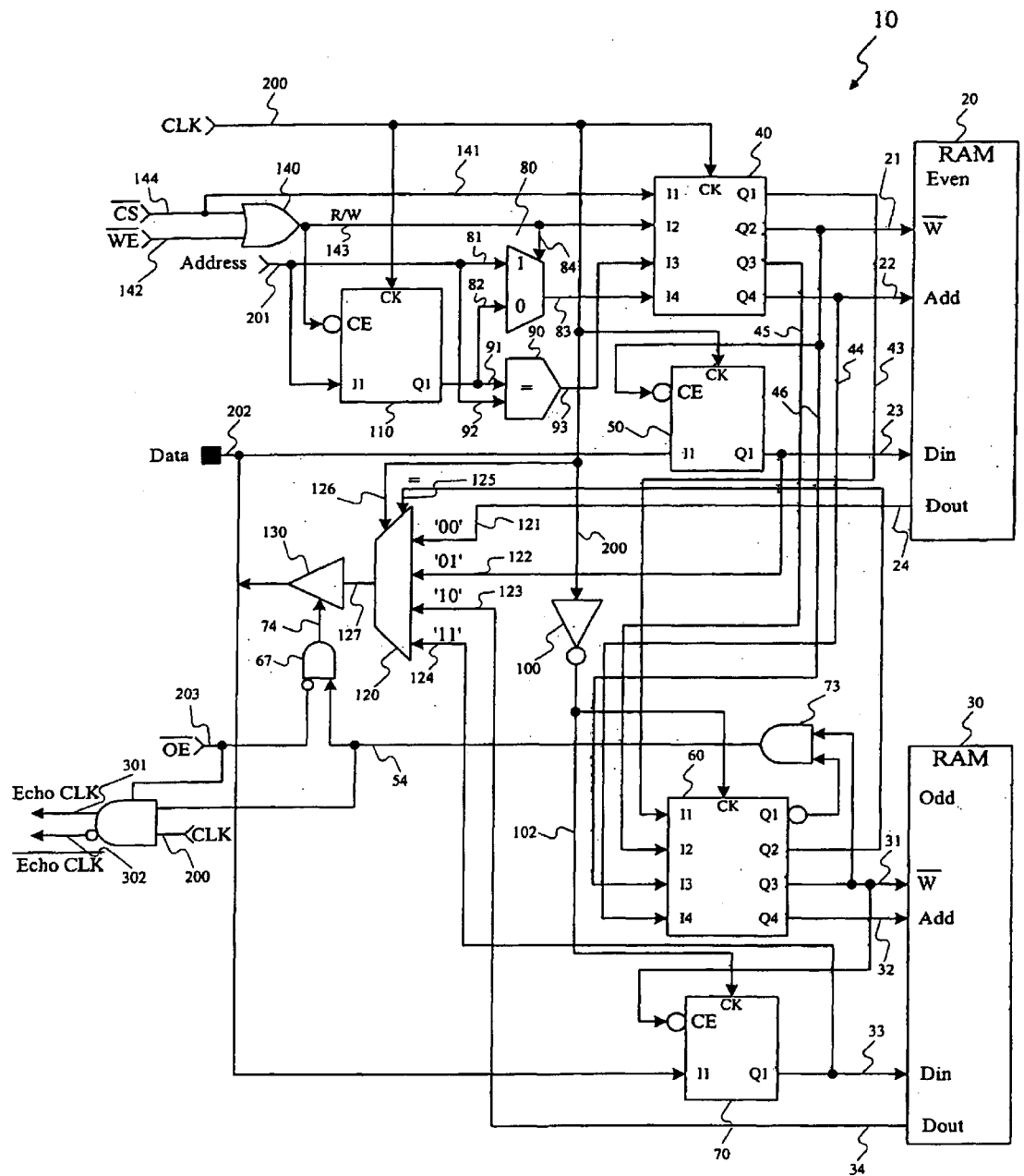
FIG. 1 is a block diagram of a preferred embodiment of a double data rate SRAM in accordance with the present invention.

FIG. 1 is a block diagram of a DDR integrated SRAM 10. SRAM 10 is a burst synchronous SRAM capable of 100% bus utilization (e.g., no idle cycles in a bus turn around) with only one clock cycle latency between address and data for both read and write operations.

SRAM 10 has an address bus 201 for receiving an address, a data bus 202 for providing read data and receiving write data, three input terminals 141, 142, and 203 for receiving the respective control signals $\overline{CS}$, $\overline{WE}$, and $\overline{OE}$, and an input terminal 200 for receiving the system clock CLK. SRAM 10 includes two identical memory blocks 20 and 30, five clocked registers 40, 50, 60, 70, and 110, two multiplexers 80 and 120, a comparator 90, a 3-state output buffer 130, and four logic gates 67, 73, 100, and 140. The five clocked registers are clocked by the rising edges of the clock signal at their respective CK input terminals. However, the invention is not limited to the registers being clocked by the rising edges, or by any other particular features or circuitry, except as defined by the appended claims.

OR gate 140 is a two input gate with its first and second input terminals connected to $\overline{CS}$ terminal 141 and $\overline{WE}$ terminal 142 respectively, and its output terminal connected to lead 143. Register 110 has: an input bus I1 connected to address bus 201, and a corresponding output bus Q1; an inverting input terminal CE connected to lead 143; and an input terminal CK connected to CLK terminal 200. Comparator 90 has a first input bus 91 connected to output bus Q1 of register 110, a second input bus 92 connected to address bus 201, and an output terminal 93. Mux 80 is a two to one mux and has a first input bus 81 connected to address bus 201, a second input bus 82 connected to output bus Q1 of register 110, a control input terminal 84 connected to lead 143, and an output bus 83. Mux 80 selects the data on one of its two input buses for transfer to its output bus in accordance with the following table:

TABLE 1

| Control input 84 | Output (bus 83) |
|---|---|
| 0 | Address at bus 82 |
| 1 | Address at bus 81 |

Register 40 has: an input terminal I1 connected to $\overline{CS}$ terminal 141, and a corresponding output terminal Q1 connected to lead 43; an input terminal I2 connected to lead 143, and a corresponding output terminal Q2 connected to lead 44; an input terminal I3 connected to output terminal 93 of comparator 90, and a corresponding output terminal Q3 connected to lead 45; an input bus I4 connected to output bus 83 of mux 80, and a corresponding output bus Q4 connected to bus 46; and an input terminal CK connected to CLK terminal 200. Register 50 has: an input bus I1 connected to data bus 202, and a corresponding output bus Q1; an inverting input terminal CE connected to lead 44, and an input terminal CK connected to CLK terminal 200. Inverter 100 has an input terminal connected to CLK terminal 200, and an output terminal connected to lead 102.

Register 60 has: an input terminal I1 connected to lead 43, and a corresponding inverting output terminal Q1; an input terminal I2 connected to lead 45, and a corresponding output terminal Q2; an input terminal I3 connected to lead 44, and a corresponding output terminal Q3 connected to lead 71; an input bus I4 connected to bus 46, and a corresponding output bus Q4; and an input terminal CK connected to lead 102. Register 70 has: an input bus I1 connected to data bus 202, and a corresponding output bus Q1; an inverting input terminal CE connected to the output terminal Q3 of register 60, and an input terminal CK connected to lead 102.

Mux 120 is a four to one multiplexer and has a first input bus 121, a second input bus 122 connected to output bus Q1 of register 50, a third input bus 123, a fourth input bus connected to output bus Q1 of register 70, a first control input terminal 125 connected output terminal Q2 of register 60, a second control input terminal 126 connected to CLK terminal 200, and an output bus connected to bus 127. Mux 120 selects the data on one of its four input buses for transfer to its output bus in accordance with the following table:

TABLE 2

| Control input 126 (CLK) | Control input 125 | Output (bus 127) |
| --- | --- | --- |
| 0 | 0 | Dout 24 |
| 0 | 1 | Din 23 |
| 1 | 0 | Dout 34 |
| 1 | 1 | Din 33 |

Output buffer 130 has an input bus connected to bus 127, a control input terminal connected to lead 74, and an output bus connected to data bus 202. AND gate 67 is a two input gate, and has an inverting input terminal connected to $\overline{OE}$ terminal 203, a second input terminal connected to lead 54, and an output terminal connected to lead 74. AND gate 73 is a two input gate with its first and second input terminals respectively connected to inverting output terminal Q1 and output terminal Q3 of register 60, and its output terminal connected to lead 54.

Gate 300 is a two input, two output AND gate, and has a first input terminal connected to lead 54, a second input terminal connected to CLK terminal 200, a first output terminal 301 for providing EchoCLK signal and a second inverting output terminal 302 for providing $\overline{EchoCLK}$ signal. Gate 300 also has a control input terminal connected to $\overline{OE}$ terminal 203.

Memory blocks 20 and 30 are internally identical, each having a read/write control input terminal $\overline{W}$, an address bus Add, a data-in bus Din, and a data-out bus Dout. Memory block 20 has: $\overline{W}$ terminal 21 connected to lead 44, Add bus 22 connected to bus 46, Din bus 23 connected to output bus Q1 of register 50, and Dout bus 24 connected to input bus 121 of mux 120. Memory block 30 has: $\overline{W}$ terminal 31 connected to output terminal Q3 of register 60, Add bus 32 connected to output bus Q4 of register 60, Din bus 33 connected to output bus Q1 of register 70, and Dout bus 34 connected to input bus 123 of mux 120. Memory blocks 20 and 30 operate asynchronously. If the $\overline{W}$ input of block 20 or 30 is low, the block stores the data provided on its input Din. If $\overline{W}$ is high, the block provides read data on output Dout.

Figure 2:
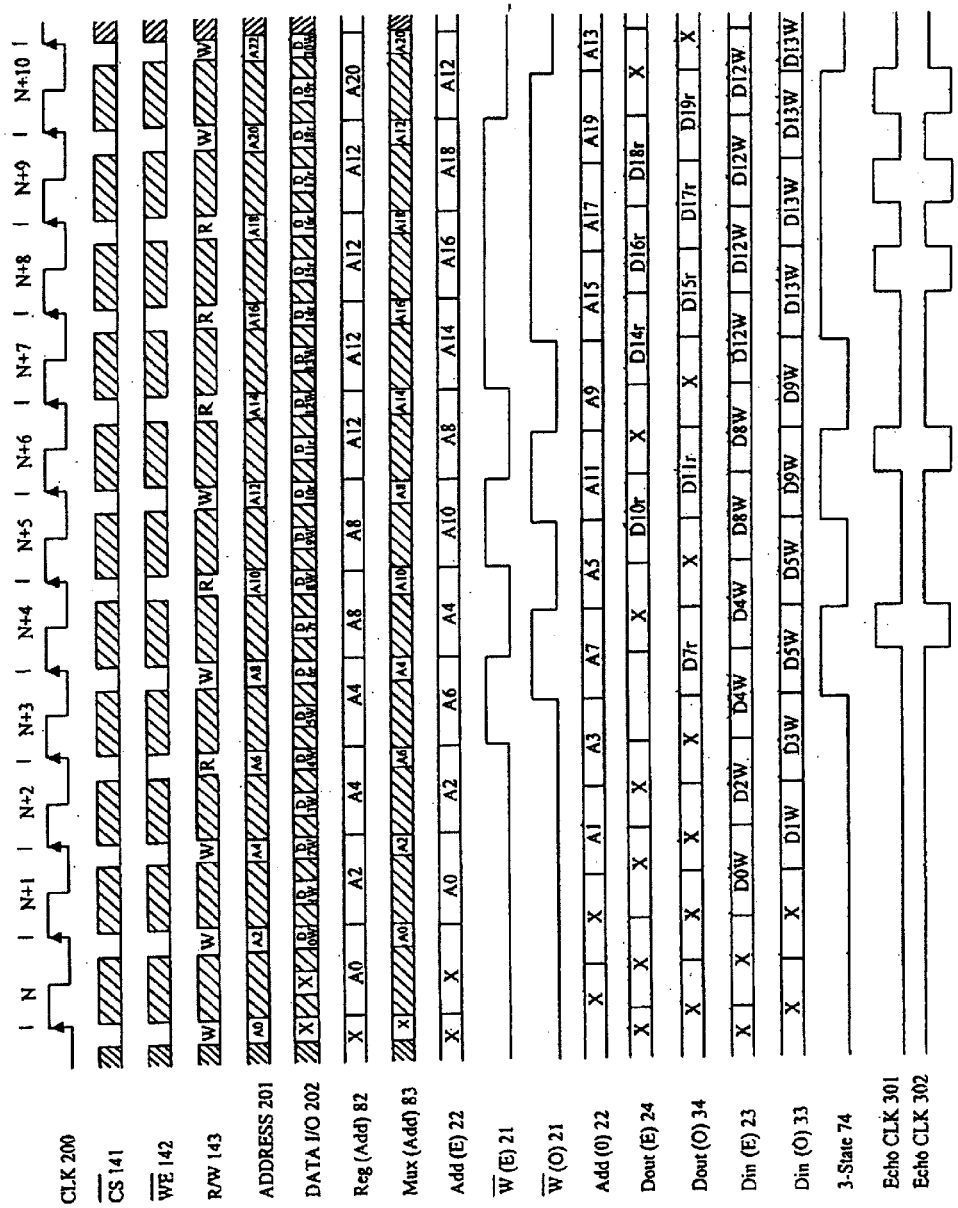
FIG. 2 is a sample timing diagram showing the waveforms for some signals in the FIG. 1 block diagram.

FIG. 2 is a sample timing diagram showing the waveforms for CLK, $\overline{CS}$, $\overline{WE}$, address, data, EchoCLK, $\overline{EchoCLK}$ and some of the internal leads of SRAM 10. Twelve clock cycles (N to N+11) are illustrated. Each clock cycle starts at the rising edge of system clock CLK. Shaded areas indicate the times that the signal is allowed to change. The number next to each signal name corresponds to the numbered buses, terminals, and leads in FIG. 1.

Data is transferred to or from SRAM 10 in bursts of two data items. The two data items are both either read or write data. Each burst is initiated on the rising edge of clock CLK. In a read burst, the address is provided to memory block 20 (through register 40) on the rising edge starting the burst operation. For example, in the read started on the rising edge of cycle N+3 in FIG. 2, the read address A6 is provided to block 20 on the rising edge of N+3. The same address is provided to memory block 30 (through register 60) on the next falling edge. Memory blocks 20 and 30 provide respective data on their respective Dout buses. Multiplexer 120 selects the Dout bus from block 20 when clock CLK becomes low (i.e. starting the falling edge), and selects the Dout output from memory block 30 when the system clock becomes high (starting the rising edge of the next clock cycle).

In a write burst, the address is latched by SRAM 10 before the data. For example, in the burst initiated in clock cycle N, the write address A0 is latched by register 110 from bus 201 at the rising edge of cycle N, the first data item D0w is latched by register 50 from bus 202 at the rising edge of cycle N+1, and the second data item D1w is latched by register 70 from bus 202 at the falling edge of cycle N+1. However, the write address is delayed by register 40, so the registers 40 and 50 supply the write address and the first data item to memory block 20 at the same time. Registers 60 and 70 supply the write address and the second data item to memory block 30 at the same time.

If the write operation is immediately followed by a read or a dead cycle, the write data are not written to memory blocks 20 and 30. The write data are stored in registers 50 and 70, and the write address is stored in register 110, until the next write operation.

We now describe the write, read sequence on the example of the A12 write, A14 read bursts in more detail. The write burst at address A12 is initiated at the rising edge of clock cycle N+6 by asserting a low voltage on the $\overline{WE}$ terminal 142 ($\overline{CS}$ signal must be active, i.e., a low voltage). A burst of two data items D12w and D13w corresponding to the external address A12 are provided at data bus 202 at the respective rising and falling edges of clock cycle N+7. Signal R/W at the output of OR gate 140 (which is the same as the $\overline{WE}$ signal when $\overline{CS}$ is active) is used to set up registers 110, 50, and 70 for storing the respective address A12 and data D12w and D13w by pulling their inverted CE input terminals low at the proper time. The CE terminal of register 110 is pulled low just prior to the N+6 cycle. The CE terminal of register 50 is pulled low through register 40 upon the rising edge of clock cycle N+6. The CE terminal of register 70 is pulled low through registers 40 and 60 upon the falling edge of clock cycle N+6.

Thus, address A12 is stored in register 110 at the rising edge of clock cycle N+6, and data D12w and D13w are stored in the respective registers 50 and 70 at the respective rising and falling edges of the next clock cycle N+7. The address and data are maintained in these registers until the next write cycle, i.e., cycle N+10. At the rising edge of clock cycle N+10, the low $\overline{WE}$ signal initiating the write burst at address A20 is provided to the $\overline{W}$ terminal of memory block 20 through OR gate 140 and register 40. This causes data D12w in register 50 to be written to memory block 20 at the internal address A12. Half a clock cycle later, at the falling edge of clock cycle N+10, $\overline{WE}$ low is provided to the $\overline{W}$ terminal of memory block 30 through register 60. This causes data D13w in register 70 to be written to memory block 30 at the internal address A12.

Note that address A12 stored in register 110 is selected by mux 80 just prior to clock cycle N+10 when the R/W signal is low (in accordance with Table 1), and is provided to the Add bus 22 of memory block 20 through register 40 at the rising edge of clock cycle N+10. Half a clock cycle later, at the falling edge of clock cycle N+10, address A12 is provided to the Add bus 32 of memory block 30 through register 60.

Also note that the $\overline{WE}$ low signal initiating the A12 write burst in the N+6 clock cycle also causes data D8w and D9w (stored in respective registers 50 and 70 during the preceding write burst operation) to be written to respective memory blocks 20 and 30 at the internal address A8 (stored in registers 110 and 60 during the preceding write burst operation).

The read burst at address A14 is initiated at the rising edge of clock cycle N+7 by asserting a high voltage on the $\overline{WE}$ terminal 142 (the $\overline{CS}$ signal must be active). Two data items D14r and D15r corresponding to the external address A14 are sequentially provided on data bus 202 at the respective rising and falling edges of clock cycle N+8. With a high $\overline{WE}$ signal, registers 110, 50, and 70 are disabled through their respective CE input terminals at the proper time. The high $\overline{WE}$ signal propagates through OR gate 140 and causes mux 80 to select address A14 on address bus 201 in accordance with Table 1.

Upon the rising edge of clock cycle N+7, address A14 and the high $\overline{WE}$ signal are clocked in by register 40 and presented respectively to Add bus 22 and $\overline{W}$ terminal 21 of memory block 20. Register 40 holds A14 and the high $\overline{WE}$ signal for the full clock cycle N+7. Memory block 20 provides data D14r, which corresponds to the internal address A14, to input bus 121 of mux 120 via Dout bus 24. In accordance with Table 2, mux 120 selects its input bus 121 when clock CLK becomes low (i.e., data D14r can pass through mux 120 on or after the falling edge of clock cycle N+7). 3-state output buffer 130 provides the data on its input bus 127 to data bus 202 when the signal at its 3-state input terminal 74 goes high. Thus, data D14r is provided on data bus 202 in the second half of clock cycle N+7 as shown in FIG. 2 (note that the $\overline{OE}$ signal must be active).

The address A14 and the high $\overline{WE}$ signal are passed on to memory block 30 by register 60 upon the falling edge of clock cycle N+7. Register 60 holds A14 and the high $\overline{WE}$ signal for a full clock cycle. Memory block 30 provides data D15r, which corresponds to the internal address A14, to input bus 123 of mux 120 via Dout bus 34. In accordance with Table 2, mux 120 selects its input bus 123 when clock CLK becomes high (i.e., data D15r can pass through mux 120 on or after the rising edge of clock cycle N+8). Output buffer 130 then provides data D15r to data bus 202 since its 3-state signal is high, as shown in FIG. 2.

The 3-state signal of output buffer 130 is controlled by the $\overline{WE}$ signal through registers 40 and 60 and AND gates 73 and 67. The 3-state signal is used to ensure that output buffer 130 is enabled only for read bursts. As indicated in FIG. 2, the 3-state signal is active only if and whenever valid read data is provided on data bus 202. This allows the initiation of a read burst without requiring external tracking of the progress of the burst.

In a read burst, each read data item can be made available on data bus 202 for an entire half cycle if the address-to-data time of memory blocks 20 and 30 is a half cycle or less. For example, data item D6r can be provided on data bus 202 starting at the falling edge of cycle N+3, and not later as in FIG. 2. However, for a given address-to-data time of memory blocks 20 and 30, the ability to provide the read data item on data bus 202 more than a half cycle after the initiation of the read burst enables the clock frequency to be increased compared to the case wherein the read data item is required to be available on data bus 202 within a half cycle after the initiation of the read burst.

Because of the use of mux 120 instead of an output register, the time from clock CLK to data out is similar to a registered output, but the access of memory blocks 20, 30 is asynchronous. This enables a faster memory access time by not requiring the data setup time prior to clock of an output register since the mux selection can be made as the data is propagating through device 10. Also, by eliminating the output register, the latency between read address and read data is reduced from two clock cycles to one. Mux 120 may be replaced by a controlled selection device, for example, a driver which can be enabled at the appropriate time in the cycle.

Note that the advantages of using mux 120 can also be realized in conventional synchronous memory devices (e.g., synchronous DRAMs and PROMs) by using a clock-controlled selection circuit instead of the conventional output register. The selection circuit similar to mux 120 allows read data to pass through to the output bus if the clock condition is met. In other words, the selection circuit is enabled by the clock signal half a clock cycle after the read address is clocked in by the input register (e.g., register 40). The selection circuit may be a simple transmission gate controlled by the clock signal.

As the above description of the A12 read burst, A14 write burst sequence indicates, having two separate memory blocks 20, 30 allows a read from one memory block to overlap with a write to the other memory block. For example, in the first half of cycle N+7, the data item D13w is being written to memory block 30 while the data item D14r is being read from memory block 20.

A special condition arises when the read address equals the latest preceding write address. Under this condition, the latest preceding write data have not yet been written to the memory blocks 20 and 30, but a read request has been issued for the data. The read is handled as follows.

At the start of the latest preceding write burst, the write address was written to register 110 as described above. After that, no writes have taken place, so the $\overline{CS}$ signal or the $\overline{WE}$ signal, or both, have been high on the rising CLK edges. Hence, the CE input of register 110 has been high on the rising CLK edges, so register 110 has continued to store the latest preceding write address. Comparator 90 always compares an incoming address received at its input bus 92 with the write address stored in register 110. If the two addresses match, comparator 90, through registers 40 and 60, causes the control input terminal 125 (marked as "=") of mux 120 to go high at the appropriate time. In accordance with Table 2, if clock CLK is low, mux 120 selects the data provided by register 50 on input bus 122 rather than the data provided by memory block 20 on input bus 121. If clock CLK is high, mux 120 selects the data provided by register 70 on input bus 124 rather than the data provided by memory block 30 on input bus 123.

Once a burst (read or write) is initiated, it progresses to completion. Thus, control signals $\overline{WE}$ and $\overline{CS}$ and the address need not be maintained throughout the burst. If dead cycles are required, they can be inserted using the $\overline{CS}$ and/or $\overline{OE}$ control signals.

The burst length can be made greater than two by providing a corresponding greater number of internal memory blocks. As with the length of two, longer bursts are carried out as the same internal address is passed from one memory block to the next on each edge of the clock. A longer burst causes the data bus to be occupied for more clock cycles, and allows the address bus and the control signal $\overline{WE}$ to be free for longer periods.

The data rate on SRAM data bus 202 is twice the data rate on any one of the Dout buses of memory blocks 20 and 30. One reason for this is that the reading from memory blocks 20 and 30 overlaps. A full clock cycle is available for each read from each memory block. For example, in a read from memory block 20 in the A6 read burst, A6 is provided to block 20 at the start of clock cycle N+3, and the data D6r can be read out to data bus 202 any time before the end of cycle N+3, provided the set-up and holding times for the reading (target) device (not shown) are satisfied. The block 30 read is also allowed to take one full cycle starting at the falling edge of cycle N+3. The two reads overlap in the second half of cycle N+3.

Similarly, the writes to blocks 20 and 30 overlap. Although the actual write to memory blocks 20 and 30 occur in a write cycle other than the one to which the write data corresponds, nevertheless, registers 50 and 70 are clocked at half the speed at which the data are provided on data bus 202. A whole cycle is allowed to write to a memory block, and one half a cycle is allowed for overlap.

Further, in a write burst following a read burst, a write to block 20 and a read from block 30 overlap. Similarly, if a read burst follows a write burst, a read from block 20 and a write to block 30 overlap.

Hence, the external address on bus 201 is at half the toggle rate of the clock CLK for a burst of two. If longer burst lengths are implemented, the external address could be even slower.

SRAM 10 can be disabled during any clock cycle by holding $\overline{CS}$ high on the rising edge of the clock. While disabled, SRAM 10 completes any activities initiated in previous clock cycles. Internally, SRAM 10 performs a read operation on whatever address is on address bus 201 at the initiation of the disable cycle. This is because when $\overline{CS}$ is high, the R/W signal on lead 143 goes high (i.e., a read operation). But, no data will be driven to data bus 202 because the high $\overline{CS}$ signal propagates through registers 40 and 50, and AND gates 73 and 67, and disables buffer 130 prior to the time the data for the disabled cycle reaches output buffer 130.

SRAM 10 can be configured to have a dedicated data-in bus for write data and a dedicated data-out bus for read data by simply connecting the I1 input bus of registers 50 and 70 to the data-in bus, and the output bus of output buffer 130 to the data-out bus. With separate data buses, there is no bus turned around and thus there are no data contention issues. However, in a read cycle the data-in bus is idle, and in a write cycle the data-out bus is idle.

Typically, in a read operation the clock along with the read instruction are delivered to the SRAM and the SRAM returns the indicated response to a target device. In very high speed clocking arrangements and where the target device is a clocked device, coordinating the clock with the return data is difficult because of latencies and differences in routing of the data and the clock. The result is that the data read from the SRAM is not coordinated with the clock (the data often arrives at the target device later than that allotted by the clock cycle), and read errors at the target device occur.

To eliminate the potential read errors at the target device, dedicated clock signals EchoCLK and $\overline{EchoCLK}$ are provided for being routed to the target device along with the read data. By ensuring that the EchoCLK and $\overline{EchoCLK}$ timing coincide with the read data availability at the data bus 202, any potential timing skews between the clock and the data at the target device reading the SRAM 10 are eliminated. Further, the EchoCLK and $\overline{EchoCLK}$ signals are active only during read bursts (i.e., these signals change with clock CLK only when the 3-state signal is high). This simplifies the system design by eliminating the need for a separate signal notifying the target device of the data transfer from SRAM 10.

As shown in FIG. 1, EchoCLK/$\overline{EchoCLK}$ signals are generated by AND gate 300. Gate 300 allows EchoCLK/$\overline{EchoCLK}$ signals to respond to the CLK signal only when read data is provided on data bus 202. EchoCLK/$\overline{EchoCLK}$ signals do not respond to the CLK signal when either the $\overline{OE}$ control signal is high, or when lead 54 is low (i.e. when data bus 202 is in 3-state). Gate 300 should be designed to have a gate delay shorter than or equal to that of mux 120 plus output buffer 130. This ensures that EchoCLK can be used externally with a zero hold time register (not shown) to capture any data appearing on data bus 202. The EchoCLK/$\overline{EchoCLK}$ signals help the system achieve the maximum possible setup time on the target device, while the hold time is minimized.

The $\overline{EchoCLK}$ signal is provided to facilitate clocking of data on both the rising and falling edges of clock CLK. The rising edge of EchoCLK can be used to clock rising edge data, and the rising edge of $\overline{EchoCLK}$ can be used to clock falling edge data. Also, EchoCLK and $\overline{EchoCLK}$ can be used differentially if the application requires it. Note that the EchoCLK and $\overline{EchoCLK}$ signals are not necessary for the proper operation of SRAM 10, and merely support the external use of the SRAM. Thus, the EchoCLK and $\overline{EchoCLK}$ signals and the associated circuitry may be eliminated if the application does not use them.

In accordance with the invention, among other features and advantages, double data transfer rate per clock cycle, only one clock cycle of latency in each of read and write bursts, and 100% bus utilization (i.e., no idle clock cycles in bus turn arounds) are achieved.

The dual data rate SRAM of the present invention is intended for but not limited to high speed read/write applications, such as network switches and routers, which receive and store data in a memory before data are transmitted (here both read and write can be carried out without interfering with each other), or graphics applications where data is loaded into the graphics memory and then fed out continuously to a video screen.

The above description of the present invention is intended to be illustrative and not limiting. The invention is not limited to any particular circuitry or timing, to the number of external address bits provided to the memory, to any signal being provided on a rising or falling edge, or to edge-sensitive circuitry. The invention is not limited to an integrated SRAM 10, i.e., discrete components may be used to implement SRAM 10. The invention is not limited to any particular type of memory blocks 20 and 30, which can be asynchronous, synchronous, or perhaps other types of memories, known or to be invented. The invention includes all variations and modifications falling within the scope of the appended claims.

What is claimed is:

1. A synchronous memory circuit comprising:
   an address bus for receiving an address;
   at least two memory blocks each of which is capable to be accessed at said address; and
   a data bus for receiving data items for transfer to or from the memory blocks,
   wherein in two consecutive clock cycles at least a first and a second write data items corresponding to a first write burst operation are capable of being transferred sequentially to the memory circuit via the data bus and at least a first and second read data items corresponding to a first read burst operation are capable of being provided sequentially by the memory circuit via the data bus, and
   wherein the data bus is capable of receiving data corresponding to the write burst operation and providing data corresponding to the read burst operation with no dead cycles therebetween; and further including
   an output circuit for receiving the at least first and second read data items from respective at least two memory blocks in the first read burst operation and allowing the first read data item to be provided on the data bus half a clock cycle after the first read burst operation is initiated, and allowing the second read data item to be provided on the data bus one clock cycle after the first read burst operation is initiated; and
   at least two registers for providing both a burst address received at the address bus and at least one read/write control signal received at least one input terminal of the memory circuit to the at least two memory blocks sequentially in one clock cycle.

2. The memory circuit of claim 1 wherein the at least first and second write data items are provided on the data bus at least one clock cycle after the first write burst operation is initiated, and the at least first and second read data items are provided on the data bus at least one clock cycle after the first read burst operation is initiated.

3. The memory circuit of claim 2 further comprising at least one input terminal for receiving at least one read/write control signal for indicating a read burst or a write burst operation, wherein each of the first write burst operation and the first read burst operation is initiated upon an edge of a clock cycle by asserting the read/write control signal to indicate-the write burst or-the read burst operation and providing a burst address at the address bus both prior to the rising edge of the clock cycle.

4. The memory circuit of claim 1 wherein in two and a half consecutive clock cycles at least a third and a fourth data items corresponding to a second write or read burst operation are capable of being transferred to or from respective at least two memory blocks and at least a fifth and sixth data items corresponding to a third write or read burst operation are capable of being transferred to or from respective the at least two memory blocks.

5. The memory circuit of claim 4 wherein transferring the at least third and fourth data items to or from the respective at least two memory blocks overlaps with transferring the at least fifth and sixth data items from respective the at least two memory blocks during half a clock cycle.

6. The memory circuit of claim 1 wherein the first write burst operation comprises writing at least a third and fourth write data items to respective two memory blocks so that writing the third write data item overlaps with writing the fourth write data item, the at least third and fourth write data items corresponding to a last write burst operation prior to the first write burst operation.

7. The memory circuit of claim 6 wherein each of the at least third and fourth write data items is written in one clock cycle, and writing the third write data item overlaps with writing the fourth write data item during half a clock cycle.

8. The memory circuit of claim 1 wherein the first read burst operation comprises reading the at least first and second read data items from respective two memory blocks so that reading the first read data item overlaps with reading the second read data item.

9. The memory circuit of claim 8 wherein each of the at least first and second read data items is read in one clock cycle, and reading the first read data item overlaps with reading the second read data item during half a clock cycle.

10. The memory circuit of claim 1 further comprising an output circuit for receiving the at least first and second read data items from respective at least two memory blocks in the first read burst operation and allowing the first read data item to be provided on the data bus half a clock cycle after the first read burst operation is initiated, and allowing the second read data item to be provided on the data bus one clock cycle after the first read burst operation is initiated.

11. The circuit of claim 10 wherein the output circuit is enabled only when a valid read data item is to be provided on the data bus so that no external tracking of the progress of a read burst operation is required.

12. The memory circuit of claim 11 further comprising at least one input terminal for receiving at least one read/write control signal for initiating a read burst operation or a write burst operation, wherein the output circuit is enabled by a 3-state signal generated from the read/write control signal.

13. The memory circuit of claim 10 wherein the output circuit comprises a multiplexer for receiving a clock signal and the at least first and second read data items and sequentially transferring to an output bus of the multiplexer the at least first and second read data items in accordance with the state of the clock signal.

14. The circuit of claim 1 wherein at the initiation of the first read burst operation the at least two registers provide both a read burst address received at the address bus and the least one read/write control signal indicating a read burst operation to one of the at least two memory blocks, and half a clock cycle after the initiation of the first read burst operation the at least two registers provide both the read burst address and the at least one read/write control signal indicating a read burst operation to the other one of the at least two memory blocks.

15. The circuit of claim 1 wherein the at least two registers are serially connected, and one of the at least two registers receives the clock signal and the other register receives the compliment of the clock signal.

16. The memory circuit of claim 1 wherein in the first write burst operation at least a third and fourth write data items are written to respective at least two memory blocks, the third and fourth write data items corresponding to a last write burst operation prior to the first write burst operation.

17. The memory circuit of claim 16 wherein the third write data item is written to one of the at least two memory blocks at the initiation of the first write burst operation, and the fourth write data item is written to the other one of the at least two memory blocks half a clock cycle after the initiation of the first write burst operation.

18. The memory circuit of claim 17 further comprising at least two registers for storing respective at least two write data items provided on the data bus in a write burst operation, wherein in the last write burst operation the at least third and fourth write data items are stored in the respective at least two registers, the at least two registers providing the third write data item to one of the at least two memory blocks at the initiation of the first write burst operation and providing the fourth write data item to the other one of the at least two memory blocks half a clock cycle after the initiation of the first write burst operation.

19. The memory circuit of claim 18 wherein one of the at least two registers receives a clock signal and the other one of the at least two registers receives the complement of the clock signal.

20. The memory circuit of claim 19 further comprising a comparator for comparing a burst address of a current burst operation with a write burst address of a preceding write burst operation stored in a third register, wherein in the first read burst operation the comparator compares a read burst address corresponding to the first read burst operation with a write burst address corresponding to the first write burst operation and allows the at least first and second write data items stored in respective two registers in the first write burst operation to be provided at the data bus if the read burst address and the write burst address are the same and the first write burst operation is followed by the first read burst operation.

21. The memory circuit of claim 18 wherein if a read burst address for the first read burst operation and a write burst address for the first write burst operation are the same and the first write burst operation is followed by the first read burst operation, in the first read burst operation the at least first and second write data items stored in respective at least two registers in the first write burst operation are sequentially provided at the data bus.

22. The memory circuit of claim 1 wherein the memory circuit is a static random access memory (SRAM).

23. A synchronous memory circuit comprising:
an address bus for receiving an address;
at least two memory blocks each of which is capable to be accessed at said address;
a data bus for receiving data items for transfer to or from the memory blocks,
wherein in two consecutive clock cycles at least a first and a second write data items corresponding to a first write burst operation are capable of being transferred sequentially to the memory circuit via the data bus and at least a first and second read data items corresponding to a first read burst operation are capable of being provided sequentially by the memory circuit via the data bus,
wherein in the first write burst operation at least a third and fourth write data items are written to respective at least two memory blocks, the third and fourth write data items corresponding to a last write burst operation prior to the first write burst operation, and
wherein the data bus is capable of receiving data corresponding to the write burst operation and providing data corresponding to the read burst operation with no dead cycles therebetween; and
further comprising a multiplexer for selecting for transfer to the at least two memory blocks one of a write burst address stored in a first register and a burst address provided on the address bus, wherein in the first write burst operation the multiplexer selects a first write burst address stored in the first register, the first write burst address corresponding to the last write burst operation, and in the first read burst operation the multiplexer selects a first read burst address provided on the address bus.

24. The memory circuit of claim 23 wherein the first register holds a write burst address until a next write burst is initiated.

25. A synchronous memory circuit comprising:
an address bus for receiving an address;
at least two memory blocks each of which is capable to be accessed at said address;
a data bus for receiving data items for transfer to or from the memory blocks,
wherein in two consecutive clock cycles at least a first and a second write data items corresponding to a first write burst operation are capable of being transferred sequentially to the memory circuit via the data bus and at least a first and second read data items corresponding to a first read burst operation are capable of being provided sequentially by the memory circuit via the data bus, and
wherein the data bus is capable of receiving data corresponding to the write burst operation and providing data corresponding to the read burst operation with no dead cycles therebetween; and
further comprising a circuit for generating an echo clock signal from the clock signal such that the echo clock signal is active only when a read data item is provided on the data bus.

26. The memory circuit of claim 25 wherein the data bus comprises:
a data-in bus for receiving write data items; and
a data-out bus for providing read data items.

27. A method of accessing a synchronous memory circuit, the method comprising:
(A) initiating a first write burst operation for sequentially transferring at least a first and second write data items to the memory circuit in a first clock cycle; and
(B) initiating a first read burst operation for sequentially transferring at least a first and second read data items from the memory circuit in a second clock cycle,
wherein the first and second clock cycles are two consecutive clock cycles;
(C) generating an echo clock signal from a clock signal, the echo clock signal being active only when a read data item is read from the memory circuit.

28. The method of claim 27 further comprising:
(D) initiating the first write burst operation in a third clock cycle, the first clock cycle being the next sequential clock cycle after the third clock cycle; and
(E) initiating the first read burst operation in a fourth clock cycle, the second clock cycle being the next sequential clock cycle after the fourth clock cycle.

29. The method of claim 28 wherein:
act (D) comprises:
(F) asserting a read/write control signal on an input terminal of the memory circuit to indicate a write burst operation prior to a rising edge of the third clock cycle; and
(G) providing a first write burst address on an address bus of the memory circuit prior to the rising edge of the third clock cycle, and
act (E) comprises:
(H) asserting the read/write control signal to indicate a read burst operation prior to a rising edge of the fourth clock cycle; and
(I) providing a first read burst address on the address bus prior to the rising edge of the fourth clock cycle.

30. The method of claim 27 wherein the memory circuit includes at least two memory blocks, the method further comprising:
(J) transferring at least a third and fourth data items corresponding to a second burst operation to or from respective at least two memory blocks; and (K) transferring at least a fifth and sixth data items corresponding to a third burst operation to or from respective at least two memory blocks, wherein acts (J) and (K) are carried out in two and half consecutive clock cycles.

31. The method of claim 30 wherein said transferring the at least third and fourth data items to or from respective at least two memory blocks overlaps with said transferring the at least fifth and sixth data items to or from respective at least two memory blocks during half a clock cycle.

32. The method of claim 27 wherein the memory circuit includes two memory blocks and act (A) comprises:

(L) writing at least a third and fourth write data items to respective two memory blocks so that writing the third write data item overlaps with writing the fourth write data item, the at least third and fourth write data items corresponding to a last write burst operation prior to the first write burst operation.

33. The method of claim 32 wherein act (L) comprises:

(M) writing the third write data item in one clock cycle; and (N) writing the fourth write data item in one clock cycle, wherein said writing the third write data item overlaps with said writing the fourth write data item during half a clock cycle.

34. The method of claim 27 wherein the memory circuit includes two memory blocks and act (B) comprises:

(O) reading the at least first and second read data items from respective two memory blocks so that reading the first read data item overlaps with reading the second read data item.

35. The method of claim 34 wherein act (O) comprises:

(P) reading the first read data item in one clock cycle; and (Q) reading the second read data item in one clock cycle, wherein said reading the first read data item overlaps with said reading the second read data item during half a clock cycle.

36. A synchronous memory circuit comprising:

an address bus for receiving a burst address;

two memory blocks;

data bus for transferring data corresponding to the burst address to or from the two memory blocks;

a control input terminal for receiving a read/write control signal for indicating a read burst or a write burst operation, wherein a burst operation is initiated upon a rising edge of a clock cycle by asserting the read/write control signal to indicate a write burst or a read burst operation and providing an address at the address bus both prior to the rising edge of the clock cycle;

an output circuit for receiving two read data items from respective two memory blocks in a first read burst operation and allowing one of the two read data items to be provided on the data bus half a clock cycle after the first read burst operation is initiated, and allowing the other one of the two read data items to be provided on the data bus one clock cycle after the first read burst operation is initiated; and a first and second registers for storing respective two write data items provided on the data bus in a first write burst operation, wherein one of the two write data items is written to one of the two memory blocks at the initiation of a next write burst operation following the first write burst operation, and the other one of the two write data items is written to the other one of the two memory blocks half a clock cycle after the initiation of the next write burst operation, wherein in two consecutive clock cycles the two write data items are capable of being transferred to the memory circuit via the data bus and the two read data items are capable of being transferred from the memory circuit via the data bus.

37. The memory circuit of claim 36 further comprising:

a multiplexer for selecting for transfer to the two memory blocks one of a write burst address stored in a third register and a burst address provided on the address bus, wherein in the next write burst operation the multiplexer selects a first write burst address stored in the third register, the first write burst address corresponding to the first write burst operation, and in the first read burst operation the multiplexer selects a first read burst address provided on the address bus; and a fourth and fifth serially connected registers for providing both the read/write control signal and the burst address selected by the multiplexer to one of the two memory blocks at the initiation of a burst operation and to the other one of the two memory blocks half a clock cycle after the initiation of the burst operation.

38. The memory circuit of claim 37 wherein each of the first, third, and fourth registers receives the clock signal, and each of the second and fifth registers-receives the complement of the clock signal.

39. The memory circuit of claim 36 further comprising a comparator for comparing a burst address at the address bus with a write burst address stored in a third register, wherein in a second read burst operation corresponding to a second read burst address if the second read burst address is the same as a second write burst address stored in the third register the comparator causes a first and second write data items stored in the respective first and second registers to be provided at the data bus, the first and second write data items and the second write burst address corresponding to a last write burst operation before the second read burst operation.

40. The memory circuit of claim 39 wherein the output circuit comprises a multiplexer having four input buses for receiving a respective four read data items two read data items from the respective two memory blocks and two read data items from the respective two first and second registers, and two control input terminals for receiving a respective clock signal and signal generated from the comparator, wherein the multiplexer selects one of the four read data items for transfer to the data bus in accordance with the states of the clock signal and the signal generated from the comparator.

41. The memory circuit of claim 36 wherein the output circuit comprises:

a multiplexer for sequentially transferring to an output bus of the multiplexer the two read data items in accordance with the state of the clock signal; and an output buffer for receiving the two read data items from the output bus of the multiplexer and providing the two read data items to the data bus when enabled, wherein the output buffer is enabled only when a valid read data item is to be provided on the data bus so that no external tracking of the progress of a read burst operation is required.

42. The memory circuit of claim 36 wherein each of the two memory blocks comprises an address bus for receiving a burst address, an input terminal for receiving a read/write control signal for indicating a read burst or a write burst operation, a data-in bus for receiving a write data item, and a data-out bus for providing a read data item, wherein each of the two memory blocks operates asynchronously.

43. The memory circuit of claim 36 wherein the memory circuit is a static random access memory (SRAM).

44. A memory circuit, comprising:

a first register that receives and stores an address on a first transition of a clock signal;

a second register that receives and stores the address from the first register on a second transition of the clock signal;

a first memory block coupled to receive the address from the first register; and a second memory block coupled to receive the address from the second register, wherein a first data is read into the first memory block and a second data is read into the second memory block in one cycle of the clock signal when a write signal is associated with the address, the first data and the second data each being part of a single data word.

45. The memory circuit of claim 44, further including a comparison circuit, the comparison circuit being capable of comparing a read address with the address received into the first register and providing data in response to a read operation before that is written into the first memory block and the second memory block.

46. A memory circuit, comprising:

a first register that receives and stores an address on a first transition of a clock signal;

a second register that receives and stores the address from the first register on a second transition of the clock signal;

a first memory block coupled to receive the address from the first register; and a second memory block coupled to receive the address from the second register, wherein a first data is read out from the first memory block and second data is read out from the second memory block in one cycle of the clock signal when a read signal is associated with the address, the first data and the second data each being part of a single data word.

47. A memory circuit, comprising:

a first register that receives and stores an address on a first transition of a clock signal;

a second register that receives and stores the address from the first register on a second transition of the clock signal;

a first memory block coupled to receive the address from the first register; and a second memory block coupled to receive the address from the second register, wherein a read access can occur in a first cycle of the clock signal and a write access can occur in a second cycle immediately following the first cycle with no dead cycles between.

48. A memory circuit, comprising:

a first register that receives and stores an address on a first transition of a clock signal;

a second register that receives and stores the address from the first register on a second transition of the clock signal;

a first memory block coupled to receive the address from the first register; and a second memory block coupled to receive the address from the second register, wherein a write access can occur in a first cycle of the clock signal and a read access can occur in a second cycle immediately following the first cycle with no dead cycles between.

49. A memory circuit, comprising:

a first register that receives and stores an address on a first transition of a clock signal;

a second register that receives and stores the address from the first register on a second transition of the clock signal;

a first memory block coupled to receive the address from the first register; and a second memory block coupled to receive the address from the second register, wherein each memory location of the first memory block stores a first portion of a data word and a corresponding memory location of the second memory block stores a second portion of a data word.

50. The memory circuit as in one of claims 44–49, further including a read/write terminal that receives a read signal or a write signal associated with the address.

51. The memory circuit as in one of claims 44–49, further including a circuit that allows performance of a write burst.

52. The memory circuit as in one of claims 44–49, further including a circuit that allows performance of a read burst.

* * * * *